US012797918B2

(12) United States Patent
Nurmi

(10) Patent No.: US 12,797,918 B2
(45) Date of Patent: Nov. 17, 2026

(54) ELECTRONIC COMPONENT AND METHOD FOR CLEANING BONDING TOOL

(71) Applicant: Murata Manufacturing Co., Ltd., Nagaokakyo (JP)

(72) Inventor: Sami Nurmi, Tuusula (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 35 days.

(21) Appl. No.: 18/887,836

(22) Filed: Sep. 17, 2024

(65) Prior Publication Data

US 2025/0100025 A1 Mar. 27, 2025

(30) Foreign Application Priority Data

Sep. 22, 2023 (EP) .................................... 23199079

(51) Int. Cl.
*B08B 7/00* (2006.01)
*H10W 72/00* (2026.01)

(52) U.S. Cl.
CPC ......... *B08B 7/00* (2013.01); *H10W 72/01571* (2026.01); *H10W 72/07118* (2026.01); *H10W 72/075* (2026.01)

(58) Field of Classification Search
CPC . H01L 24/78; H01L 24/85; H01L 2224/7801; H01L 2224/8591
See application file for complete search history.

(56) References Cited

FOREIGN PATENT DOCUMENTS

| | | | |
|---|---|---|---|
| JP | 2000-232125 | A | 8/2000 |
| JP | 2008-270270 | A | 11/2008 |
| JP | 2009-004672 | A | 1/2009 |
| JP | 4840117 | B2 | 12/2011 |

*Primary Examiner* — Shay Karls
(74) *Attorney, Agent, or Firm* — ArentFox Schiff LLP

(57) ABSTRACT

An electronic component is provided that includes a package, at least one electronic chip housed within an enclosure inside the package, and at least one first bonding pad, at least one second bonding pad, and at least one bond connected to at least one bonding pad and at least one second bonding pad for establishing an electric connection between the electronic chip and surrounding circuitry. A cleaning pad is provided in the package. The cleaning pad is spaced from first bonding pad and second bonding pad, designed to be electrically disconnected from other structures or components, and designed to enable cleaning of a bonding tool.

20 Claims, 5 Drawing Sheets

ELECTRONIC COMPONENT AND METHOD FOR CLEANING BONDING TOOL

CROSS REFERENCE TO RELATED APPLICATIONS

This application claims priority to European Patent Application No. 23199079.7, filed Sep. 22, 2023, the contents of which are hereby incorporated by reference in its entirety.

TECHNICAL FIELD

The present disclosure relates to cleaning a bonding tool in connection with bonding of electronic components, and more particularly to an electronic component. The present disclosure further concerns a method for cleaning a bonding tool.

BACKGROUND

Electronic chips, which may also be called dies, may be placed inside a protective package which forms an enclosure where the chip is protected from the surrounding environment. The chip may be mechanically attached to a support structure inside the enclosure, such as a die pad, and electrically connected to contacts which extend outside of the enclosure. The packaged chip thereby forms an electronic component which can be mounted on a circuit board.

Bonding pads are widely used in connection with electronic components for establishing the electrical connections. Bonding pads are used for instance in connection with MEMS components and similar devices. Bonding pads may serve as connection points for external electrical connections allowing transfer of electrical signals, power and data between the MEMS devices and the surrounding circuitry.

Bonding pads are typically made of conductive materials and placed to enable forming of bonds, such as wire bonds, by a bonding tool to connect the electronic component to the bonding pad and thereby to surrounding circuitry.

A problem with bonding tools is that the manufacturing process typically does not enable continuous use of the bonding tool, but there are short breaks due to the structure of the parts or the phases of the manufacturing process during which the bonding tool is not used for implementing wire bonds. Even very short breaks, such as breaks of a couple of seconds, may cause the bonding tool to cool down. Thereby, the first wire bonds implemented after such a break may be colder. In addition, cleaning of the bonding tool may be needed for instance due to contamination of the tool due to impurities in the surrounding air or for other causes.

SUMMARY OF THE INVENTION

An object of the present disclosure is to provide a method and an electronic component.

The disclosure is directed to providing the electronic component with a cleaning pad.

An advantage of the method and electronic component of the disclosure is that the bonding tool may be cleaned on every electronic component in-situ on a cleaning site provided in the package structure. This may improve wire bonding process yield due to less downtime needed and improve quality.

In some aspects, the techniques described herein relate to an electronic component including: a package; an electronic chip housed within an enclosure inside the package; a first bonding pad; a second bonding pad configured to establish an electrical connection between the electronic chip and surrounding circuitry; a bond connected to at least one of the first bonding pad or the second bonding pad; and a cleaning pad housed in the package, wherein the cleaning pad is spaced from the first bonding pad and the second bonding pad, and the cleaning pad is configured to be electrically disconnected from other structures or components and to enable cleaning of a bonding tool.

In some aspects, the techniques described herein relate to a method for cleaning a bonding tool, including: cleaning, during or after a break in a manufacturing process of an electronic component, the electronic component includes: a package; an electronic chip housed within an enclosure inside the package; a first bonding pad; a second bonding pad configured to establish an electrical connection between the electronic chip and surrounding circuitry; a bond connected to at least one of the first bonding pad or the second bonding pad; and a cleaning pad housed in the package, wherein the cleaning pad is spaced from the first bonding pad and the second bonding pad, and the cleaning pad is configured to be electrically disconnected from other structures or components and to enable cleaning of a bonding tool, and wherein the method further includes enabling cleaning of the bonding tool, the bonding tool implementing the cleaning pad.

BRIEF DESCRIPTION OF THE DRAWINGS

In the descriptions that follow, like parts are marked throughout the specification and drawings with the same numerals, respectively. The drawings are not necessarily drawn to scale and certain drawings may be illustrated in exaggerated or generalized form in the interest of clarity and conciseness. The disclosure itself, however, as well as a mode of use, further features and advances thereof, will be understood by reference to the following detailed description of illustrative implementations of the disclosure when read in conjunction with reference to the accompanying drawings, wherein.

DETAILED DESCRIPTION

Figure 1:
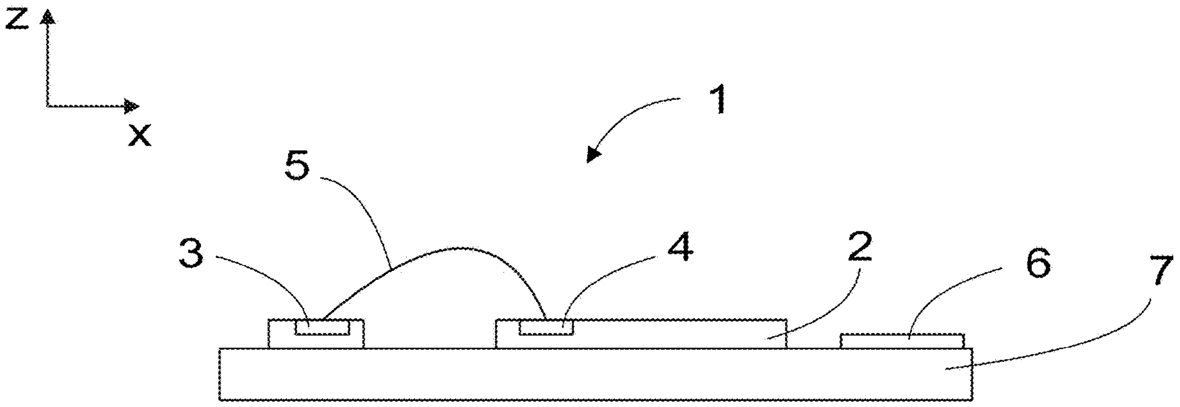
FIG. 1 illustrates schematically a part of an electronic component in cross section in accordance with exemplary aspects of the present disclosure.

Hereinbelow, aspects of the present disclosure will be described. In a following description of the drawings, the same or similar components will be represented with use of the same or similar reference characters. The drawings are exemplary, sizes or shapes of portions are schematic, and technical scope of the present disclosure should not be understood with limitation to the aspects.

Figure 2:
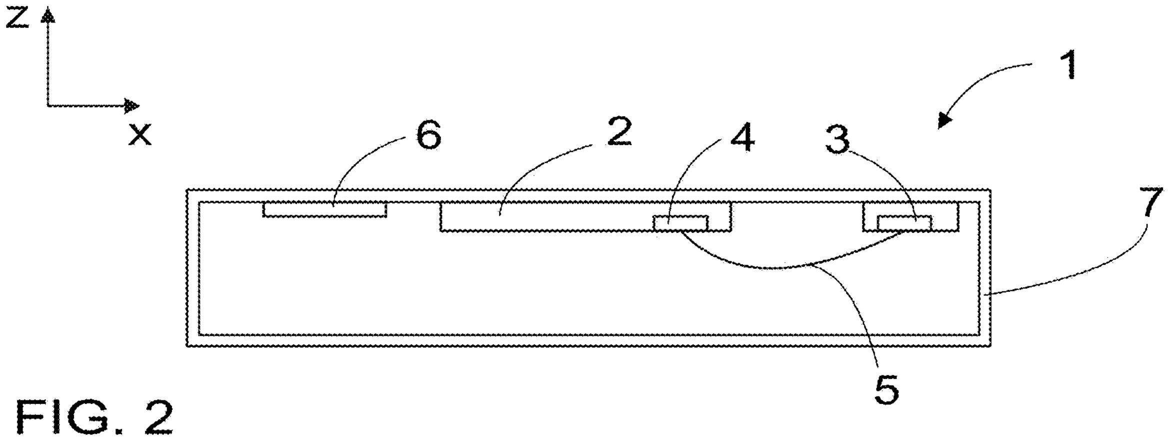
FIG. 2 illustrates schematically an electronic component in cross section in accordance with exemplary aspects of the present disclosure.
Figure 3:
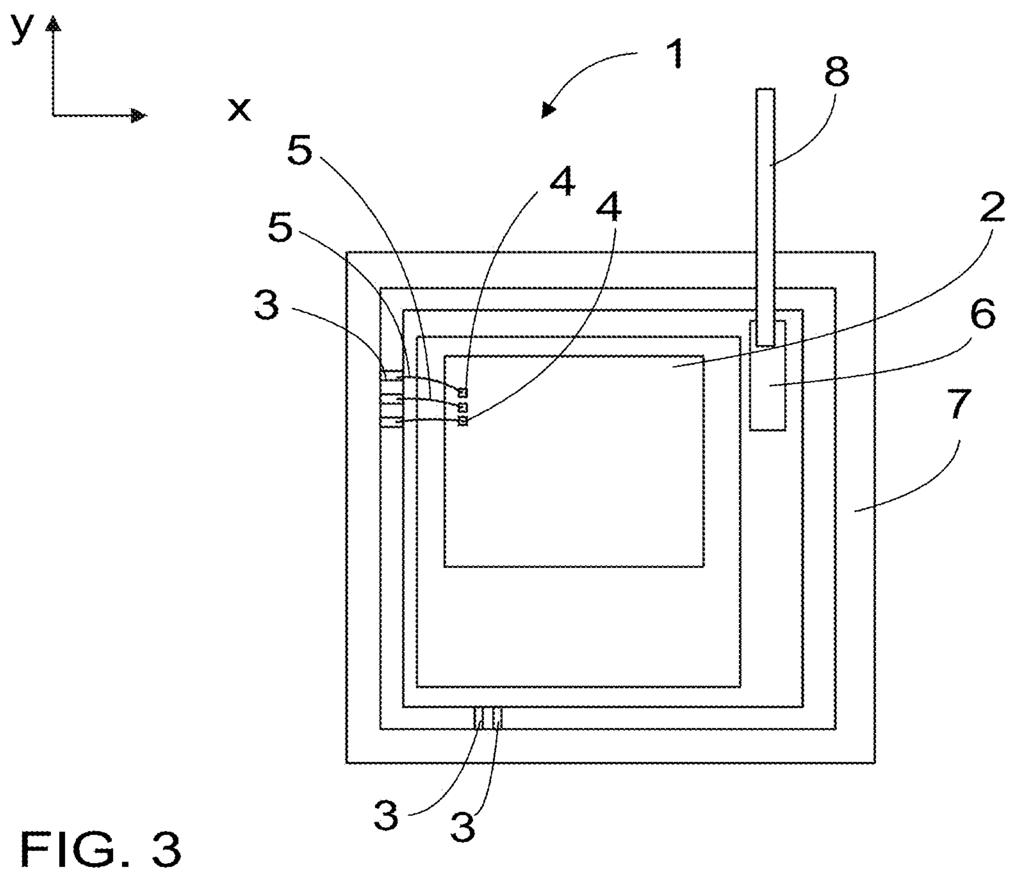
FIG. 3 illustrates schematically a partly opened electronic component seen from above in accordance with exemplary aspects of the present disclosure.
Figure 4:
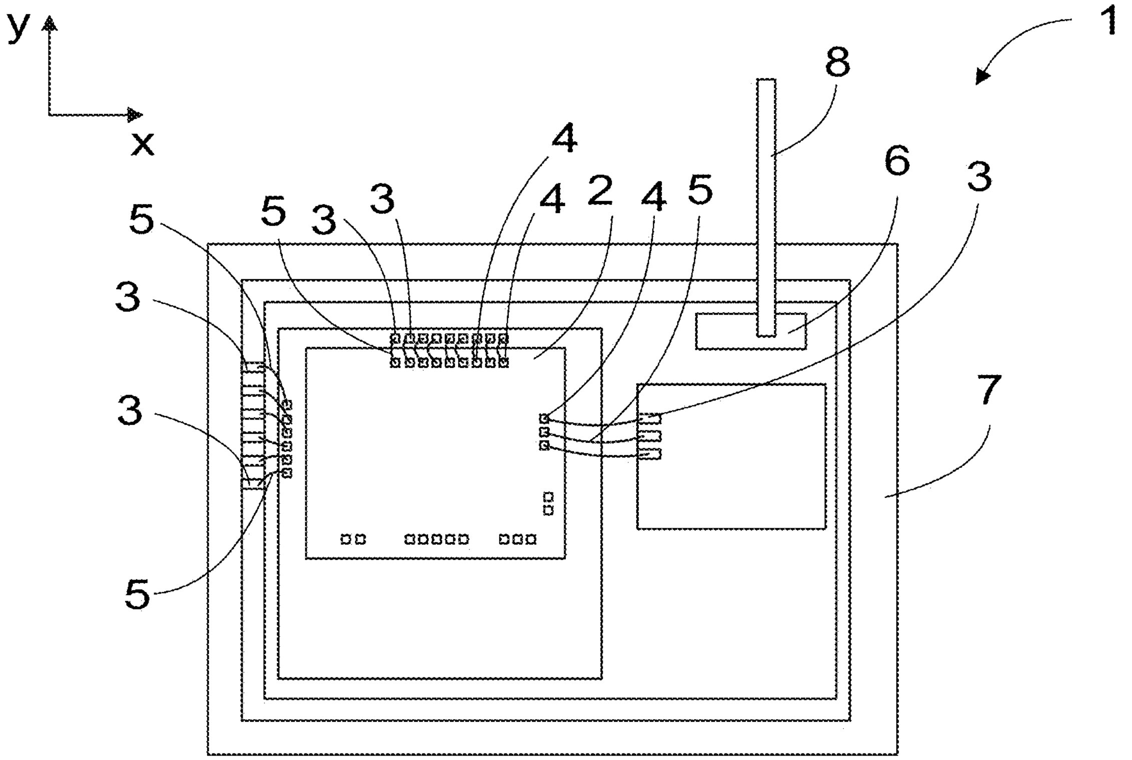
FIG. 4 illustrates schematically a second partly opened electronic component seen from above in accordance with exemplary aspects of the present disclosure.

FIG. 1 illustrates schematically a part of an electronic component in cross section; FIG. 2 illustrates schematically an electronic component in cross section; FIG. 3 illustrates schematically a partly opened electronic component seen from above; FIG. 4 illustrates schematically a second partly opened electronic component seen from above; and FIG. 5 illustrates schematically a third partly opened electronic component seen from above.

In the figures of this disclosure, the plane defined by the x-axis and y-axis is parallel to the plane of a printed circuit board (PCB), later called a circuit board in this disclosure, to which the electronic component is configured to be attached. The direction defined by the z-axis is perpendicular to the same plane of the circuit board, or a circuit board plane.

In this disclosure, the words "bottom" and "top" may only refer to how the component is configured to be placed with respect to a circuit board (PCB). The bottom side of the component is configured to be attached to the surface of the circuit board. Words such as "above" and "below" are used with the same meaning: a first part which is below a second part is configured to be closer to the circuit board, and the second part is provided on the top side of the component with respect to the first part. Words such as "bottom" and "top," "above" and "below," thus, do not refer to the orientation of the component with regard to the direction of the gravitational field of earth either when the component is manufactured or when it is in use, although they can in some cases be in agreement with this conventional meaning of top/bottom when the xy-plane is horizontal.

Figure 5:
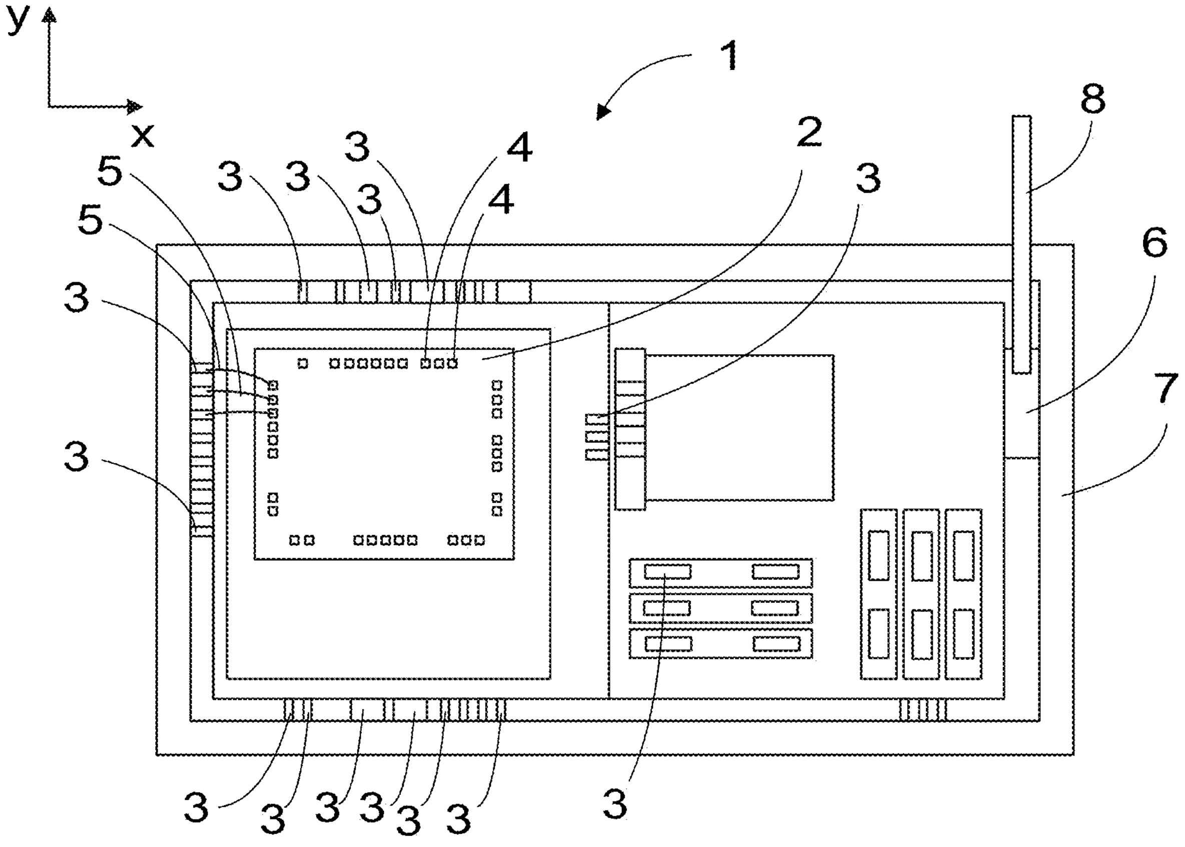
FIG. 5 illustrates schematically a third partly opened electronic component seen from above in accordance with exemplary aspects of the present disclosure.

Referring to the axes indicated in the figures, FIG. 1 shows schematically an aspect of the electronic component, more particularly a part of an electronic component, in the direction of y-axis in cross section, FIG. 2 shows schematically an aspect of the electronic component in the direction of y-axis in cross section, and FIGS. 3-5 show schematically different aspects of the electronic component partly opened, in other words with some parts of the electronic component not in place/not shown in the figures, in the direction of the z-axis, which direction is also called "from above" in this disclosure.

The electronic component 1 comprises a package 7 and at least one electronic chip 2, also called a chip 2 in this disclosure, housed within an enclosure inside the package 7. The package 7 may comprise a top, a bottom, and four sides: first side, second side, third side and a fourth side. The enclosure may then be formed withing the top, the bottom, and the four sides. FIG. 2 illustrates schematically an aspect of an electronic component 1 showing such a package in cross section, whereas FIGS. 1 and 3-5 shown aspects of an electronic component 1 in cross section and/or with a part of the package 7 not shown to better illustrate parts of the electronic component 1 provided inside the package 7.

In the electronic component 1, the electronic chip 2 is housed within the package 7. The package 7 provides protection for the electronic chip(s) 2 inside the electronic component 1. According to an aspect, the package 7 may be made of one material. According to another aspect, the package 7 may comprise multiple materials, for instance some part(s) of the package 7 may be made of one material and some other part(s) of the package 7 from another material. According to an aspect, at least a part of the package 7, such as the area of the package 7 on which the electronic chip 2 is provided and the area immediately surrounding the electronic chip 2, as shown by a rectangle around the electronic chip 2 in FIGS. 3-5, may be gold-plated or formed of ceramic material.

According to an aspect, the electronic component 1, more particularly the package 7, may comprise a package base and a cap (not shown). In such aspects, FIGS. 1-5 may illustrate schematically a package base, or a part of the package base for instance in FIG. 1, with the electronic chip 2 and possible other parts and devices before a cap is attached to the package base. In other aspects, the FIGS. 1-5 may illustrate details of electronic components 1, where a portion of the electronic component 1 is not shown for illustrative purposes. It should also be understood that the figures are provided for illustrative purposes, and electronic components 1 may comprise further parts not shown in the figures.

The package base and the cap may together form the enclosure. According to an aspect, the cap may form the bottom side of the package 7. According to an aspect, the cap may be made of a material different from the material of the rest of the package 7. According to an aspect, the package 7 may comprise at least one of the following: a plastic material, a metal material, or a ceramic material. According to an aspect, the metal material may comprise stainless steel, copper, or nickel-cobalt ferrous alloy, such as Kovar. According to an aspect, the cap may comprise at least one of the following: a metal material or a ceramic material.

According to an aspect, the package base may for instance be made of plastic. According to an aspect, the package base may be manufactured in a moulding process where the package base is moulded around a lead frame, where a chip mounting element (not shown) and electronic leads have been formed. Other methods may also be used to form a plastic package base. The package base may alternatively be made of a ceramic material. The cap can be attached to the package base with glue or with any other method. The attachment region where the cap is attached to the package base may encircle the enclosure.

According to an aspect, the electronic component 1 may comprise a single case component. In this disclosure, a single case component refers to a discrete electronic device that is enclosed within a single package or housing. In other words, all necessary elements and connections for the component to function are contained within the single package. Such single components may for instance be mounted on a circuit board or used individually depending on the application. The disclosed solution, namely the disclosed structure of an electronic component 1 and the method for cleaning a bonding tool 8, may be particularly beneficial in connection with single case components, since they do not comprise internal structures, such as lead frame feet or suitable free space, that could be used for cleaning the bonding tool 8.

According to an aspect, the electronic component 1 may comprise a MEMS component. According to an aspect, the electronic chip 2 may comprise at least one of the following: an accelerometer configured to measure acceleration, a gyroscope configured to measure angular rotation, or a magnetometer. The accelerometer or gyroscope may be a MEMS accelerometer/gyroscope. According to an aspect, the electronic chip 2 comprises another type of an orientation-sensitive chip.

The electronic component 1 further comprises at least one first bonding pad 3, at least one second bonding pad 4, and at least one bond 5 connected to at least one first bonding pad 3 and at least one second bonding pad 4 for establishing an electric connection between the electronic chip 2 and surrounding circuitry. In other words, the bond 5 may electrically connect the first bonding pad 3 and the second bonding pad 4. One of the bonding pads, for instance second bonding pad 4, may be, directly or indirectly, electrically connected to the electronic chip 2, whereby the first bonding pad 3, the second bonding pad 4, and the bond 5 may provide an electric connection between the electronic chip 2 and surrounding circuitry. The second bonding pad 4 being directly electrically connected to the electronic chip 2 refers to the second bonding pad 4 being attached to the electronic chip 2. The second bonding pad 4 being indirectly electrically connected to the electronic chip 2 refers to the second bonding pad 4 being connected to the electronic chip 2 via a further electrically conductive part or structure.

According to an aspect, the first bonding pad(s) 3 may be provided in the package 7 or other part(s) of the electronic component 1. In other words, the first bonding pad(s) 3 may be provided on an inner surface of the package 7 or other parts(s) of the electronic component 1 provided inside the package 7. More particularly, the first bonding pad(s) 3 may be provided within the enclosure. Different ways of positioning the first bonding pads 3 are shown in FIGS. 1-5. According to an aspect, at least one first bonding pad 3 may be provided in the package 7. According to an aspect, at least one first bonding pad 3 may be, directly or indirectly, electrically connected to an electronic lead of the electronic component 1. According to an aspect, a part of an electronic lead of the electronic component 1 may form the first bonding pad 3.

The electronic component 1 further comprises a cleaning pad 6. The cleaning pad 6 is provided in the package 7. In other words, the cleaning pad 6 is provided inside the package 7. More particularly, the cleaning pad 6 may, thus, be enclosed within the enclosure in the electronic component 1, when the electronic component 1 is manufactured and ready to be used and/or installed.

The cleaning pad 6 is spaced from first bonding pad(s) 3 and second bonding pad(s) 4. In other words, the cleaning pad 6 is separate from the first bonding pads 3 and second bonding pads 4. According to an aspect, the cleaning pad 6 may be provided on an inner surface of the package 7, such as best illustrated in FIG. 2. According to an aspect, the cleaning pad 6 may be provided on another part of the electronic component 1 provided inside the package 7.

The cleaning pad 6 may be designed to be electrically disconnected from other structures or components. In other words, the cleaning pad 6 is not intended to be electrically connected to other parts of the electronic component 1 or surrounding circuitry, for instance to be connected to other parts of the electronic component 1 or surrounding circuitry by a bond 5.

According to an aspect, the bond 5 may comprise a wire bond. The disclosed solution, namely the electronic component 1 and the method of cleaning a bonding tool 8, may be particularly useful in connection with wire bonding and wire bonds. According to an aspect, the bond 5 may comprise a gold wire, a copper wire, an aluminium wire, a silver wire, a wire comprising a combination of these materials, or a wire plated with one of these materials or with a material comprising a combination of these materials.

The cleaning pad 6 may also be designed to enable cleaning of a bonding tool 8. A bonding tool 8, is a tool used for creating bonds 5 between bonding pads, for instance between first bonding pads 3 and second bonding pads 4. According to an aspect, the bonding tool 8 may comprise a wire bond capillary, also called bonding capillary. Such a bonding tool 8 may be configured to create wire bonds between the bonding pads. According to an aspect, the bonding tool 8 may comprise a bonding tool of a wire bonder machine. According to an aspect, the bonding tool 8 may be configured to hold and manipulate a bonding wire during a wire bonding process. A tip of the bonding tool 8 may be configured to guide the bonding wire and bond it to the bonding pad(s) 3, 4.

According to an aspect, the cleaning pad 6 is designed to enable cleaning of the bonding tool 8 by forming at least one bond 5 on the cleaning pad 6. According to an aspect, the at least one bond 5 formed for cleaning the bonding tool 8 only extends within the area of the cleaning pad 6. In other words, the at least one bond 5 formed for cleaning the bonding tool 8 does not connect the cleaning pad 6 electrically to any further parts of the electronic component 1 or surrounding circuitry.

According to an aspect, the cleaning pad 6 is made of a process compatible material, which is called a wire bondable material in this disclosure. According to an aspect, the cleaning pad 6 is made of made of gold, nickel, silver, copper, cobalt, aluminium, tungsten, titanium, or a combination thereof. According to an aspect, one or more of the first bonding pad(s) 3, the second bonding pad(s) 4, and the cleaning pad 6 are made of a same material, such as gold, nickel, silver, copper, cobalt, aluminium, tungsten, titanium, or a combination thereof.

According to an aspect, the surface area of the cleaning pad 6 is at least two times as large as the surface area of the smallest bonding pad 3, 4. According to an aspect, the surface area of the cleaning pad 6 is at least two times as large as the surface area of the largest bonding pad 3, 4. In other words, the surface of the cleaning pad 6 may be clearly larger, for instance at least twice as large, as the surface of the first bonding pad(s) 3 and the second bonding pad(s) 4. Thereby, more than one bonds 5 may be provided on the cleaning pad 6.

According to an aspect, as referred to, the package 2 may further comprise a plurality of electronic leads (not shown) protruding from the package 7 and configured to extend from at least two sides, preferably from at least two opposite sides, of the package, such as the second side and the fourth side of the package 7. According to an aspect, the electronic leads may be configured to protrude from the package 7 at least in a direction corresponding to a downward direction. According to an aspect, the electronic leads may further be configured to extend outwards from the package 7, for instance in a bended manner.

According to an aspect, the electronic leads may be used to establish electric connections from the surrounding circuitry to the electronic chip(s) 2. In other words, the electronic chip(s) 2 may be connected to the electronic leads inside the package 7, for example by wire bonding or flip chip bonding (not shown), and the electronic leads may extend outward from the package 7 in a side direction which is substantially perpendicular to the z-axis. Electric connections to the electronic chip(s) 2 can then be made by connecting the electronic leads to suitable connectors.

Figure 6:
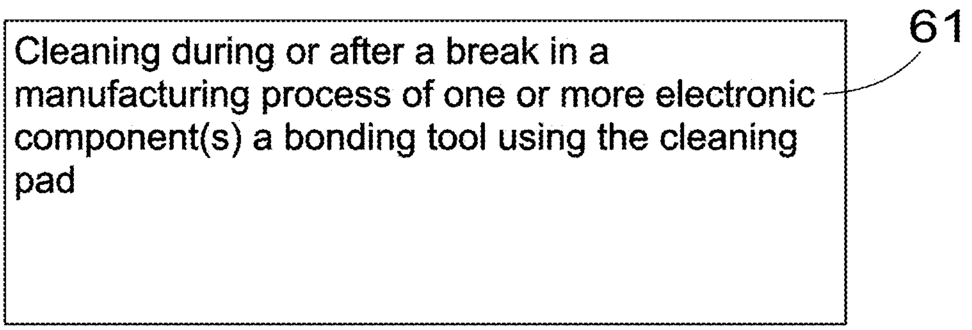
FIG. 6 illustrates schematically a method for cleaning a bonding tool in accordance with exemplary aspects of the present disclosure.

FIG. 6 illustrates schematically a method for cleaning a bonding tool.

A method for cleaning a bonding tool, such as the method of FIG. 6, may comprise cleaning 61 a bonding tool 8 during or after a break in a manufacturing process of one or more electronic component(s) 1 using the cleaning pad 6. The electronic component 1 may comprise an electronic component 1 according to an aspect disclosed in this description and/or accompanying claims and drawings, or a combination of such aspects.

In the manufacturing process of one or more electronic components 1, a break may comprise for instance, a break caused by the structure of the electronic component 1 or a phase of the manufacturing process. For instance, the electronic component 1 processed may change, the position of the electronic component 1 may need to be changed, or some other intermediate phase of the process may be necessary thus causing a break in the forming of the bonds 5. This may cause the electronic component 1 to cool down, which may affect the quality of the first bonds 5 formed after the break. In the method of this disclosure, and the method of FIG. 6, thus, the bonding tool 8 may be cleaned during such a break or immediately after the break before forming first actual bond 5, which is a bond designed to establish an electric connection between the electronic chip 2 and the surrounding circuitry, to the electronic component 1.

According to an aspect, the cleaning of the bonding tool 8 comprises forming at least one bond 5 on the cleaning pad 6. According to an aspect, the bond 5 may only extend within the area of the cleaning pad 6, as explained in connection with electronic component aspects. According to an aspect, the bond 5 may be a wire bond.

In general, the description of the aspects disclosed should be considered as being illustrative in all respects and not being restrictive. The scope of the present disclosure is shown by the claims rather than by the above description and is intended to include meanings equivalent to the claims and all changes in the scope. While preferred aspects of the invention have been described above, it is to be understood that variations and modifications will be apparent to those skilled in the art without departing from the scope and spirit of the invention.

What is claimed:

1. An electronic component comprising:

a package;

a plurality of electronic leads;

an electronic chip housed within an enclosure inside the package;

a first bonding pad;

a second bonding pad configured to establish an electrical connection between the electronic chip and surrounding circuitry;

a bond connected to at least one of the first bonding pad or the second bonding pad;

a cleaning pad housed in the package, and wherein the plurality of electronic leads extend from the package and configured to establish electric connections from the surrounding circuitry to the electronic chip, wherein the cleaning pad is enclosed within the enclosure, and the cleaning pad is spaced from the first bonding pad and the second bonding pad, and the cleaning pad is configured to be electrically disconnected from other structures or components and from the plurality of electronic leads, and to enable cleaning of a bonding tool.

2. The electronic component according to claim 1, wherein the cleaning pad comprises a wire bondable material.

3. The electronic component according to claim 2, wherein the cleaning pad comprises at least one of gold, nickel, silver, copper, cobalt, aluminium, tungsten, titanium, or a combination thereof.

4. The electronic component according to claim 3, wherein the first bonding pad, the second bonding pad, and the cleaning pad comprise at least one of gold, nickel, silver, copper, cobalt, aluminium, tungsten, titanium, or a combination thereof.

5. The electronic component according to claim 1, wherein the cleaning pad comprises at least one gold, nickel, silver, copper, cobalt, aluminium, tungsten, titanium, or a combination thereof.

6. The electronic component according to claim 5, wherein the first bonding pad, the second bonding pad, and the cleaning pad comprise at least one of gold, nickel, silver, copper, cobalt, aluminium, tungsten, titanium, or a combination thereof.

7. The electronic component according to claim 1, wherein the bond comprises a wire bond.

8. The electronic component according to claim 1, wherein the cleaning pad is configured to enable cleaning of the bonding tool by forming a second bond on the cleaning pad, and wherein the second bond only extends within an area of the cleaning pad.

9. The electronic component according to claim 1, wherein a surface area of the cleaning pad is at least two times as large as a surface area of a smallest bonding pad from the first bonding pad or the second bonding pad.

10. The electronic component according to claim 9, wherein the surface area of the cleaning pad is at least two times as large as a surface area of a largest bonding pad from the first bonding pad or the second bonding pad.

11. The electronic component according to claim 1, wherein a surface area of the cleaning pad is at least two times as large as a surface area of a largest bonding pad from the first bonding pad or the second bonding pad.

12. The electronic component according to claim 1, wherein the electronic component comprises a single case component.

13. A method for cleaning a bonding tool, comprising:

cleaning, during or after a break in a manufacturing process of an electronic component, the electronic component, wherein the electronic component comprises:

a package;

a plurality of electronic leads;

an electronic chip housed within an enclosure inside the package;

a first bonding pad;

a second bonding pad configured to establish an electrical connection between the electronic chip and surrounding circuitry;

a bond connected to at least one of the first bonding pad or the second bonding pad; and a cleaning pad housed in the package, wherein the plurality of electronic leads extend from the package and configured to establish electric connections from the surrounding circuitry to the electronic chip, and wherein the cleaning pad is enclosed within the enclosure, and the cleaning pad is spaced from the first bonding pad and the second bonding pad, and the cleaning pad is configured to be electrically disconnected from other structures or components and from the plurality of electronic leads, and to enable cleaning of a bonding tool, wherein the method further comprises enabling cleaning of the bonding tool, the bonding tool implementing the cleaning pad.

14. The method according to claim 13, wherein the cleaning of the bonding tool further comprises forming a bond on the cleaning pad, and wherein the bond only extends within an area of the cleaning pad.

15. The method according to claim 14, wherein the bond is a wire bond.

16. The method according to claim 15, wherein the cleaning pad comprises at least one of gold, nickel, silver, copper, cobalt, aluminium, tungsten, titanium, or a combination thereof.

17. The method according to claim 13, wherein the cleaning pad comprises at least one gold, nickel, silver, copper, cobalt, aluminium, tungsten, titanium, or a combination thereof.

18. The method according to claim 17, wherein the first bonding pad, the second bonding pad, and the cleaning pad each comprise at least one of gold, nickel, silver, copper, cobalt, aluminium, tungsten, titanium, or a combination thereof.

19. The method according to claim 13, wherein the first bonding pad, the second bonding pad, and the cleaning pad each comprise at least one of gold, nickel, silver, copper, cobalt, aluminium, tungsten, titanium, or a combination thereof.

20. The method according to claim 13, wherein the electronic component comprises a single case component.

* * * * *